US008513523B2

(12) United States Patent
Ambo et al.

(10) Patent No.: US 8,513,523 B2
(45) Date of Patent: Aug. 20, 2013

(54) RELAY TERMINAL MEMBER, CIRCUIT STRUCTURE INCLUDING THE SAME, AND ELECTRONIC UNIT

(75) Inventors: Tsugio Ambo, Kumagaya (JP); Yoshikazu Tanaka, Kumagaya (JP); Tetsu Hirose, Kumagaya (JP)

(73) Assignees: Furukawa Electric Co., Ltd, Tokyo (JP); Furukawa Automotive Systems, Inc., Shiga (JP)

( * ) Notice: Subject to any disclaimer, the term of this patent is extended or adjusted under 35 U.S.C. 154(b) by 298 days.

(21) Appl. No.: 13/058,184

(22) PCT Filed: Jul. 21, 2009

(86) PCT No.: PCT/JP2009/003408
§ 371 (c)(1),
(2), (4) Date: Feb. 8, 2011

(87) PCT Pub. No.: WO2010/018655
PCT Pub. Date: Feb. 18, 2010

(65) Prior Publication Data
US 2011/0139504 A1     Jun. 16, 2011

(30) Foreign Application Priority Data

Aug. 9, 2008   (JP) .................................. 2008-206469

(51) Int. Cl.
*H01R 4/00*      (2006.01)
*H01R 12/00*     (2006.01)
*H02G 3/06*      (2006.01)
*H05K 1/00*      (2006.01)

(52) U.S. Cl.
USPC ............................. 174/84 C; 174/260; 439/79

(58) Field of Classification Search
USPC ................... 174/84 C, 260, 255; 439/79, 44, 439/45, 47, 48, 50
See application file for complete search history.

(56) References Cited

U.S. PATENT DOCUMENTS

| | | | |
|---|---|---|---|
| 3,874,759 A | 4/1975 | Colombo | |
| 7,004,766 B2 * | 2/2006 | Chen et al. | 439/79 |
| 2007/0218257 A1 * | 9/2007 | Ambo | 428/209 |
| 2008/0254652 A1 | 10/2008 | Ma | |
| 2011/0116248 A1 | 5/2011 | Ambo et al. | |
| 2011/0120756 A1 | 5/2011 | Ambo et al. | |

FOREIGN PATENT DOCUMENTS

| | | |
|---|---|---|
| CN | 1939101 A | 3/2007 |
| CN | 201041912 Y | 3/2008 |
| EP | 1734621 A2 | 12/2006 |
| JP | 04-162377 | 6/1992 |
| JP | 2006-351537 | 12/2006 |
| JP | 07-048566 | 2/2007 |
| JP | 07-087748 | 4/2007 |
| JP | 07-165084 | 6/2007 |

* cited by examiner

*Primary Examiner* — Jayprakash N Gandhi
*Assistant Examiner* — Dion Ferguson
(74) *Attorney, Agent, or Firm* — Knobbe Martens Olson & Bear LLP (57) ABSTRACT

A terminal relay member includes a plurality of relay terminals, each of which has a body section in which an opening is formed so as to penetrate the body section, and a terminal section to be connected to the circuit board; and a covering section for covering the body sections. The covering section includes holes corresponding to the openings. The opening is configured so that, by inserting a terminal pin of a connector to the opening, a part of the body section around the opening is deformed toward an inner wall of the hole of the covering section to contact the terminal pin.

7 Claims, 9 Drawing Sheets

RELAY TERMINAL MEMBER, CIRCUIT STRUCTURE INCLUDING THE SAME, AND ELECTRONIC UNIT

This application is the U.S. National Phase under 35. U.S.C. §371 of International Application PCT/JP2009/003408, filed Jul. 21, 2009, which claims priority to Japanese Patent Application No. 2008-206469, filed Aug. 9, 2008. The International Application was published under PCT Article 21(2) in a language other than English

TECHNICAL FIELD

The present invention relates to a relay terminal member, a circuit structure including the relay terminal member, and an electronic unit.

BACKGROUND ART

Recently, a circuit board on which a wide variety of electronic components are mounted has been equipped in, e.g., a sophisticated automobile. A connector is significantly larger than other electronic components, and covers a large area of the circuit board. Thus, so-called "surface mounting" is particularly desired. In order to reduce the size of a circuit structure including the circuit board, and to reduce a cost, a surface mount connector has been proposed, which is mounted on a surface of a circuit board (see, e.g., Patent Documents 1 and 2).

The surface mount connector is mounted on one surface of the circuit board, and therefore electronic components, other surface mount connectors, etc. can be mounted on the other surface of the circuit board. Consequently, both surfaces of the circuit board can be effectively used, and a mounting area can be doubled.

The surface mount connector of Patent Document 1 includes an insulating housing; and a plurality of conductive terminals, each of which has a held section at which the housing holds the terminals, and in which one end of the terminal serves as a mounting-side end at which the terminal is mounted on the board. In addition, the housing includes a hollow section which is positioned between an upper surface of the housing and each of the held sections, and which reduces thermal conduction from the upper surface of the housing toward the held section side.

The surface mount connector of Patent Document 2 includes an insulating housing which holds a plurality of terminals connected to the circuit board, and which is fixed to the circuit board. In addition, the insulating housing includes a rear wall section which is vertically arranged on the circuit board, and which can hold the plurality of terminals with the terminals being arranged at least in a direction along the circuit board. The rear wall section includes a horizontal slit section which penetrates the rear wall section in its thickness direction, and which extends in the direction along the circuit board. The horizontal slit section is provided below an uppermost one of a plurality of terminal injection holes formed in the rear wall section.

When surface-mounting components on a circuit board, cream solder is typically used. That is, the cream solder is first applied to a soldering section of a printed wire of the circuit board. Subsequently, the circuit board is placed in a high-temperature furnace with the components being mounted on the cream solder. Then, the cream solder is melted for a short period of time, and then the components are soldered to the circuit board.

According to such a technique, an amount of the cream solder can be finely adjusted, and the components can be highly integrated even in a high-density integrated circuit (VLSI) by soldering without causing a solder bridge.

CITATION LIST

Patent Document

PATENT DOCUMENT 1: Japanese Patent Publication No. 2007-087748
PATENT DOCUMENT 2: Japanese Patent Publication No. 2007-165084

SUMMARY OF THE INVENTION

Technical Problem

However, a housing of a connector is typically made of low-cost general-purpose resin having thermal plasticity. Thus, there is a possibility that, when placing the housing of the connector in the furnace for soldering, the housing is deformed due to high temperature. Consequently, a problem is caused, in which reliability of the connector is reduced.

Recently, lead-free solder has been increasingly used considering environmental issues. However, such lead-free solder has a high melting point, and therefore the foregoing problem becomes more serious.

It may be able to employ resin resistant to high temperature (e.g., polyphenylene sulfide (PPS) resin) for the housing of the connector. However, it is unavoidable that a product cost is significantly increased as compared to a general-purpose connector.

The present invention has been made in view of the foregoing, and it is an object of the present invention to, even with a low-cost general-purpose connector, reduce or prevent deformation of a surface-mounting connector due to high temperature to enhance reliability.

Solution to the Problem

In order to achieve the foregoing object, a relay terminal member of the present invention configured to relay a circuit board and a connector to each other, and to place the circuit board and the connector in conduction includes a plurality of relay terminals, each of which has a body section which is in the form of plate, and in which an opening is formed so as to penetrate the body section; and a terminal section which is integrally formed with the body section, and which is connected to the circuit board; and a covering section made of insulating material, through which the terminal sections of the relay terminals are exposed, and which covers the body sections of the relay terminals. The covering section includes a plurality of holes which are formed so as to penetrate the covering section in positions corresponding to the openings of the relay terminals. The opening of the relay terminal is configured so that, by inserting a terminal pin of the connector to the opening, a part of the body section around the opening is deformed toward an inner wall side of the hole of the covering section, and the deformed part of the body section around the opening contacts the terminal pin of the connector.

The opening of the body section of the relay terminal preferably includes notches which are cuts outwardly extending in a radial direction of the opening.

In a state in which the terminal sections of the relay terminals are connected to the circuit board, a clearance may be formed between a surface of the circuit board and a surface of the covering section around the holes, which faces the surface of the circuit board.

A circuit structure of the present invention includes a circuit board; a connector; and a relay terminal member configured to relay the circuit board and the connector to each other, and to place the circuit board and the connector in conduction. The relay terminal member includes a plurality of relay terminals, each of which has a body section which is in the form of plate, and in which an opening is formed so as to penetrate the body section, and a terminal section which is integrally formed with the body section, and which is connected to the circuit board; and a covering section made of insulating material, through which the terminal sections of the relay terminals are exposed, and which covers the body sections of the relay terminals. The covering section includes a plurality of holes which are formed so as to penetrate the covering section in positions corresponding to the openings of the relay terminals. The opening of the relay terminal is configured so that, by inserting a terminal pin of the connector to the opening, a part of the body section around the opening is deformed toward an inner wall side of the hole of the covering section, and the deformed part of the body section around the opening contacts the terminal pin of the connector.

The opening of the body section of the relay terminal preferably includes notches which are cuts outwardly extending in a radial direction of the opening.

In a state in which the terminal sections of the relay terminals are connected to the circuit board, a clearance may be formed between a surface of the circuit board and a surface of the covering section around the holes, which faces the surface of the circuit board.

An electronic unit includes the circuit structure.

Features

Next, features of the present invention will be described.

When mounting the connector on the circuit board, the terminal sections of the relay terminals of the relay terminal member are connected to the circuit board. Meanwhile, the terminal pins of the connector are connected to the openings of the body sections of the relay terminals.

That is, the terminal pins of the connector are inserted to the openings of the relay terminals. Then, a part of the body section around the opening is deformed toward the inner wall side of the hole of the covering section by the inserted terminal pin. The deformed part of the body section around the opening contacts the inserted terminal pin. Thus, the relay terminal member relays the circuit board and the connector to each other, and places the circuit board and the connector in conduction. As a result, the connector is surface-mounted on the circuit board through the relay terminal member.

In the present invention, the terminal pin of the connector is inserted into the opening of the relay terminal, and then the body section of the relay terminal is deformed around the opening. Thus, the terminal pin and the relay terminal can be placed in conduction without using solder.

The relay terminal member is connected to the circuit board by soldering under a high-temperature environment, and then the connector can be connected to the relay terminal member under a room-temperature environment. That is, even if a low-cost general-purpose connector is used as the connector to be surface-mounted on the circuit board, deformation of the connector due to high temperature can be reduced or prevented, thereby enhancing reliability.

If the opening includes the notches which are the outwardly-extending cuts, a part of the body section around the opening can be easily deformed when inserting the terminal pin to the opening.

The clearance is formed between the surface of the covering section around the holes and the surface of the circuit board, and therefore a tip end section of the terminal pin inserted to the opening can be arranged in the clearance without penetrating a rear surface side of the circuit board. Thus, the rear surface side of the circuit board can be effectively used.

Advantages of the Invention

According to the present invention, the relay terminal member includes the relay terminals, each of which has the terminal section to be connected to the circuit board, and the body section in which the opening to which the terminal pin of the connector is inserted and connected is formed. Thus, the terminal sections of the relay terminal member are connected to the circuit board by soldering under the high-temperature environment, and then the connector can be connected to the openings of the relay terminal member under the room-temperature environment. Consequently, a general-purpose connector can be used, which is less resistant to high temperature. That is, even if the low-cost general-purpose connector is used as the connector to be surface-mounted on the circuit board, the deformation of the connector due to high temperature can be reduced or prevented, thereby enhancing the reliability.

DESCRIPTION OF EMBODIMENTS

Embodiments of the present invention will be described below in detail with reference to the drawings. Note that the present invention is not limited to the embodiments below.

First Embodiment of the Invention

FIGS. 1-12 illustrate a first embodiment of the present invention.

Figure 1:
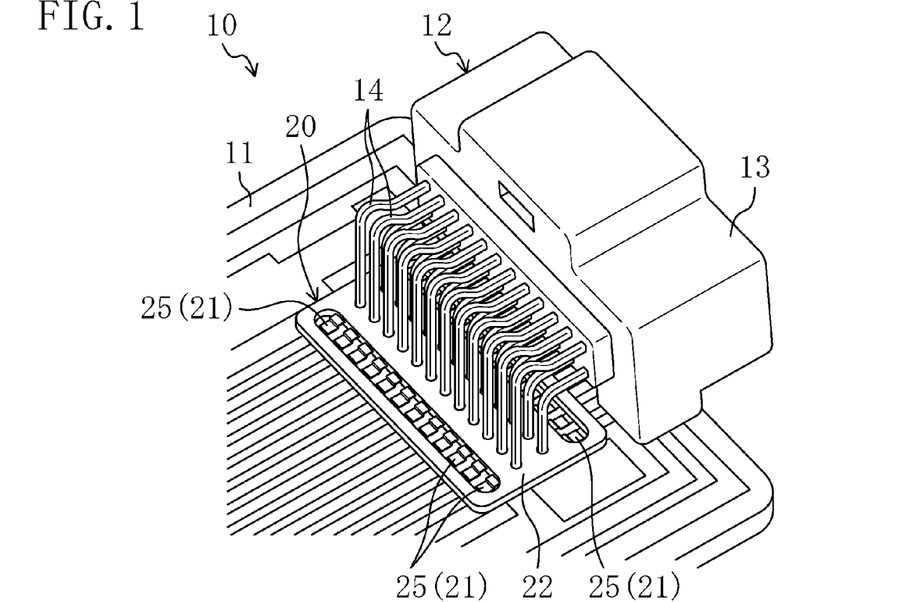
FIG. 1 is an external perspective view of a circuit structure of a first embodiment.
Figure 2:
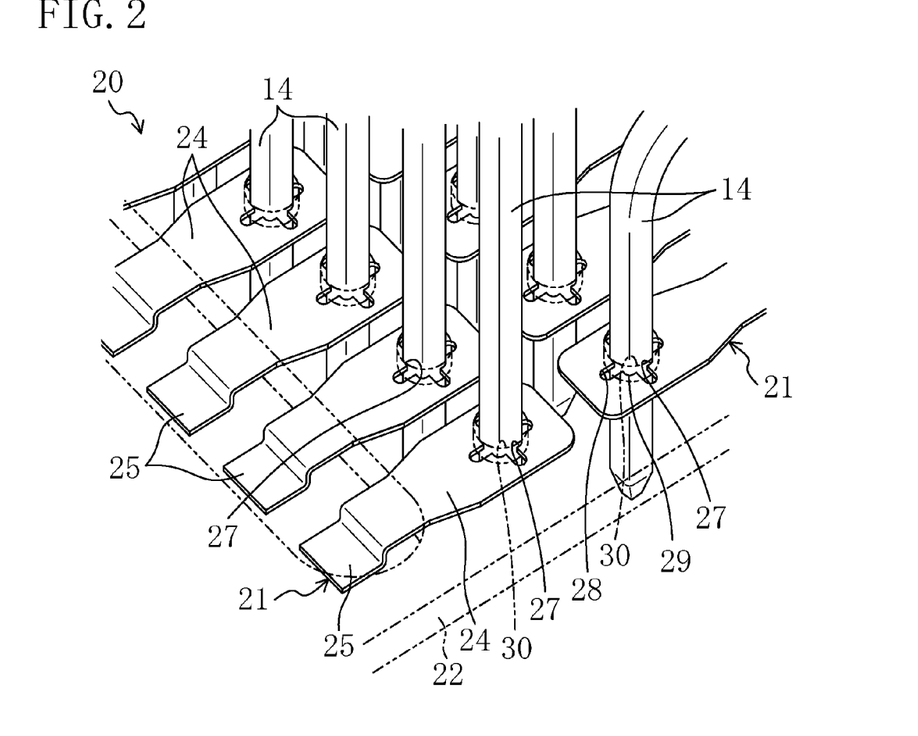
FIG. 2 is a perspective view of openings of a relay terminal member, to which terminal pins are inserted and connected.
Figure 3:
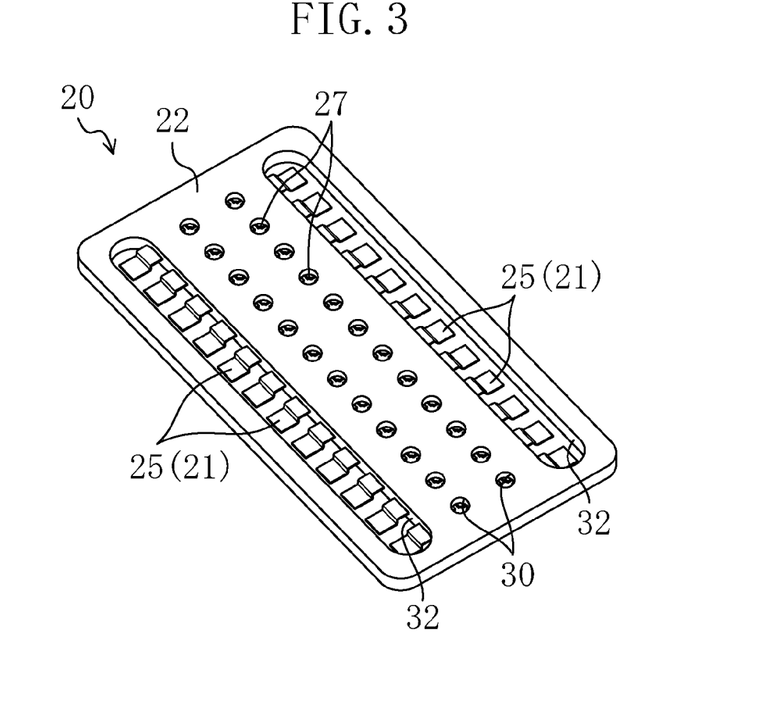
FIG. 3 is an external perspective view of the relay terminal member of the first embodiment.
Figure 4:
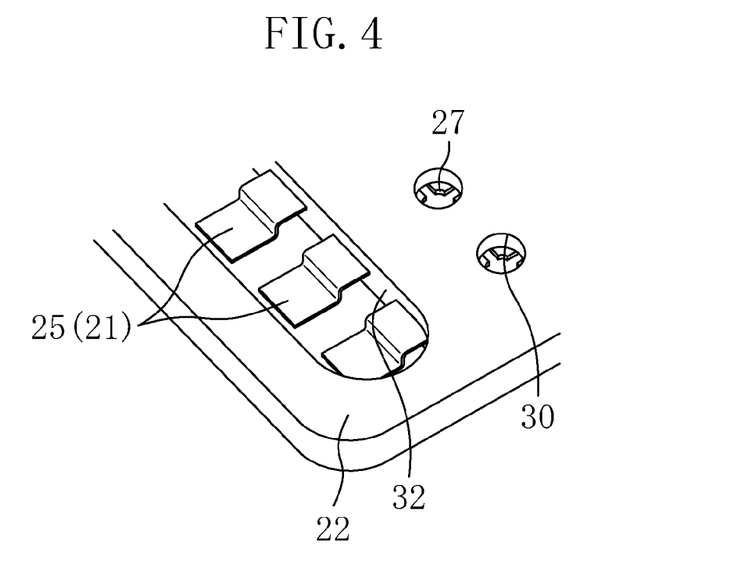
FIG. 4 is an enlarged perspective view of a part of FIG. 3.

FIG. 1 is an external perspective view of a circuit structure 10 of the first embodiment. FIG. 2 is a perspective view of openings 27 of a relay terminal member 20, to which terminal pins 14 are inserted and connected. FIG. 3 is an external perspective view of the relay terminal member 20 of the first embodiment. FIG. 4 is an enlarged perspective view of a part of FIG. 3.

Figure 5:
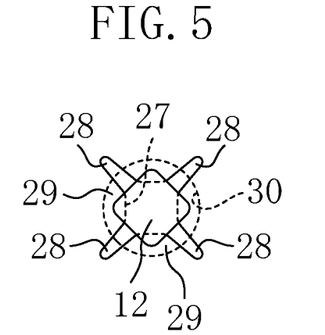
FIG. 5 is a plan view of the opening and a hole when inserting a tip end of the terminal pin to the opening and the hole.
Figure 6:
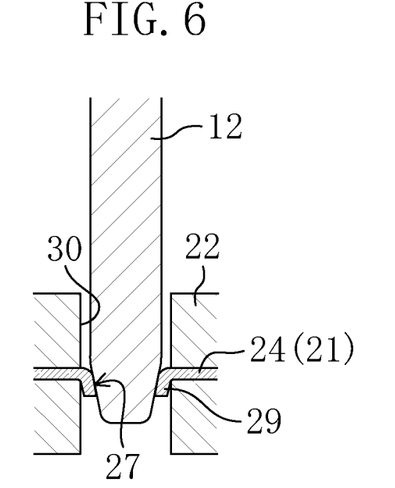
FIG. 6 is a longitudinal sectional view of the opening and the hole when inserting the tip end of the terminal pin to the opening and the hole.
Figure 7:
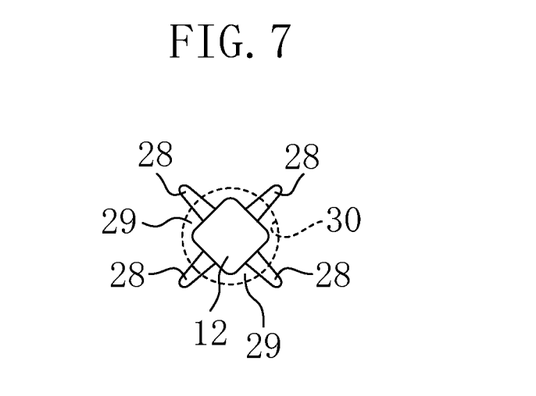
FIG. 7 is a plan view of the opening and the hole when inserting the tip end of the terminal pin so as to penetrate the opening and the hole.
Figure 8:
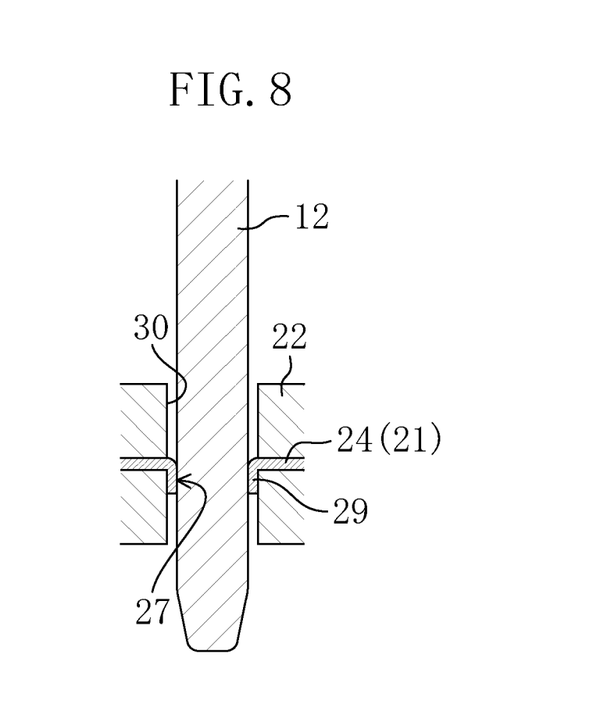
FIG. 8 is a longitudinal sectional view of the opening and the hole when inserting the tip end of the terminal pin so as to penetrate the opening and the hole.

FIG. 5 is a plan view of the opening 27 and a hole 30 when inserting a tip end of the terminal pin 14 to the opening 27 and the hole 30. FIG. 6 is a longitudinal sectional view of the opening 27 and the hole 30 when inserting the tip end of the terminal pin 14 to the opening 27 and the hole 30. FIG. 7 is a plan view of the opening 27 and the hole 30 when inserting the tip end of the terminal pin 14 so as to penetrate the opening 27 and the hole 30. FIG. 8 is a longitudinal sectional view of the opening 27 and the hole 30 when inserting the tip end of the terminal pin 14 so as to penetrate the opening 27 and the hole 30.

As illustrated in FIG. 1, the circuit structure 10 of the first embodiment includes a circuit board 11; a connector 12; and the relay terminal member 20 configured to relay the circuit board 11 and the connector 12 to each other, and to place the circuit board 11 and the connector 12 in conduction.

The circuit board 11 is a so-called "printed circuit board." In addition, a wiring pattern is formed of copper foil on a surface of an insulating board, and the wiring pattern is covered by a solder resist. In the circuit board 11, a plurality of terminals (not shown in the figure) for connecting the relay terminal member to the circuit board 11 are formed so as to be arranged in, e.g., 2×12 rows. The plurality of terminals are not covered by the solder resist, and are exposed.

The connector 12 includes an insulating housing 13, and the plurality of terminal pins 14 outwardly extending so as to penetrate a side surface of the insulating housing 13. The insulating housing 13 can be made of general-purpose resin. The general-purpose resin includes, e.g., resin such as polybutylene terephthalate (PBT) and nylon. In order to enhance shape retaining properties, glass fibers etc. may be added to such resin.

Engagement claws (not shown in the figure) for engaging and fixing the connector 12 to the circuit board 11 are formed in a bottom surface of the insulating housing 13. On the other hand, engagement holes (not shown in the figure) to be engaged to the engagement claws of the connector 12 are formed in the circuit board 11.

The terminal pins 14 are similarly formed so as to be arranged in 2×12 rows corresponding to the plurality of terminals of the circuit board 11. The plurality of terminal pins 14 are made of metal material such as copper. In addition, the plurality of terminal pins 14 are formed so as to extend from the side surface of the insulating housing 13 toward side, and are formed in substantially L-shape, i.e., are downwardly bent.

As illustrated in FIGS. 5 and 7, a cross section of the terminal pin 14 defines a rectangle of, e.g., 0.5 square mm. The terminal pin 14 is pressed into a pointed quadrangular pyramid shape at its tip end. The cross-sectional shape of the terminal pin 14 is not limited to the foregoing shape, and may be formed in, e.g., other polygonal shapes.

As illustrated in FIGS. 2-4, the relay terminal member 20 includes a plurality of plate-like relay terminals 21 made of metal material such as copper; and a covering section 22 covering a part of each relay terminal 21.

As illustrated in the enlarged view in FIG. 2, the relay terminal 21 includes a plate-like body section 24, and a terminal section 25 integrally formed with the body section 24.

The terminal section 25 is integrally formed with the body section 24, and is formed so as to have a step downwardly extending toward a front surface side of the circuit board 11 at a tip end as illustrated in FIG. 2. This allows the tip end of the terminal section 25 to be connected to the terminal of the circuit board 11.

The covering section 22 is formed in plate-like shape, and is made of insulating material such as polyphenylene sulfide (PPS) resin which is resin resistant to high temperature. As illustrated in FIG. 1, the covering section 22 includes two slit-like opening grooves 32 extending parallel to each other. The terminal sections 25 of the relay terminals 21 arranged in line are exposed through the opening grooves 32.

The body section 24 is formed in plate-like shape, and the opening 27 is formed so as to penetrate the body section 24. The opening 27 is an opening to which the terminal pin 14 of the connector 12 is inserted. In addition, as illustrated in FIGS. 5 and 7, the opening 27 includes four notches 28 which are formed in positions symmetrical about the center of the opening 27, and which are cuts outwardly extending in a radial direction. A raised section 29 curving and protruding toward an inside of the opening 27 is formed between the adjacent notches 28. As illustrated in FIGS. 5 and 7, the terminal pin 14 is inserted to the opening 27 so that four corners of the terminal pin 14 contact the raised sections 29.

As illustrated in FIG. 2, the body section 24 is embedded and covered in a middle section of the plate-like covering section 22 in a thickness direction of the covering section 22. The covering section 22 includes the plurality of holes 30 formed so as to penetrate sections of the covering section 22 corresponding to the openings 27 of the relay terminals 21. The hole 30 is formed in, e.g., circular shape, and tip ends of the raised sections 29 protrude toward an inside of the holes 30.

As illustrated in FIGS. 5-8, the opening 27 of the relay terminal 21 is configured so that, by inserting the terminal pin 14 of the connector 12 to the opening 27, tip end sections of the raised sections 29 which are a part of the body section 24 around the opening 27 are deformed toward an inner wall side of the hole 30 of the covering section 22; and that the tip end sections of the raised sections 29 contact the terminal pin 14 of the connector 12.

An electronic unit of the present invention includes the circuit structure 10 and a housing (not shown in the figure) in which the circuit structure 10 is accommodated. The housing is formed in, e.g., substantially rectangular parallelepiped shape, and includes a flat plate-like lid (not shown in the figure) and a housing body (not shown in the figure) having an opening to be closed by the lid. The circuit board 11 of the circuit structure 10 is attached to a rear surface side of the lid (i.e., an inside of the housing).

In the housing 13 of the connector 12, a socket section (not shown in the figure) is formed on a side opposite to the side on which the terminal pins 14 are provided. An opening (not shown in the figure) to which the socket section is inserted is formed in a side surface of the housing body. In a state in which the socket section of the connector 12 is inserted to the opening of the housing body, the lid is attached to the opening of the housing section to close the housing body. The lid may be fixed to the housing body, e.g., with screws and by engagement. As described above, the electronic unit is manufactured.

The circuit structure 10 may be attached not to the lid of the housing but to the housing body, or may be attached to both of the lid and the housing body.

Manufacturing Method

Next, a manufacturing method of the relay terminal member 20 will be described with reference to FIGS. 3, 4, and 9-11.

Figure 9:
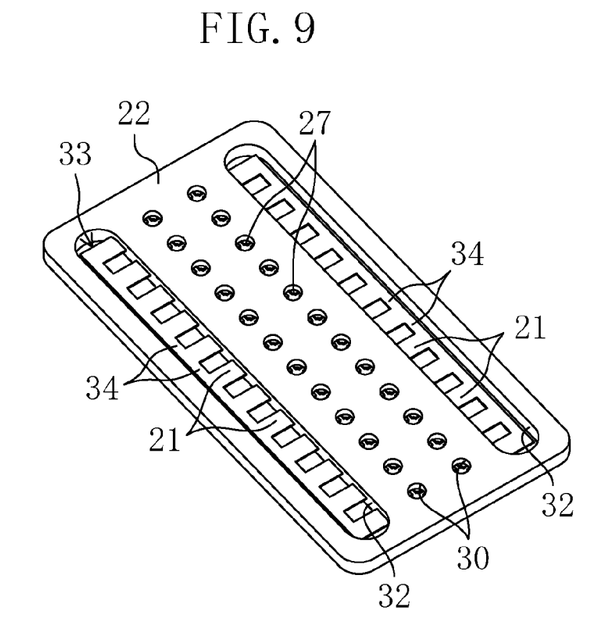
FIG. 9 is an external perspective view of relay terminals of the first embodiment before cutting.
Figure 10:
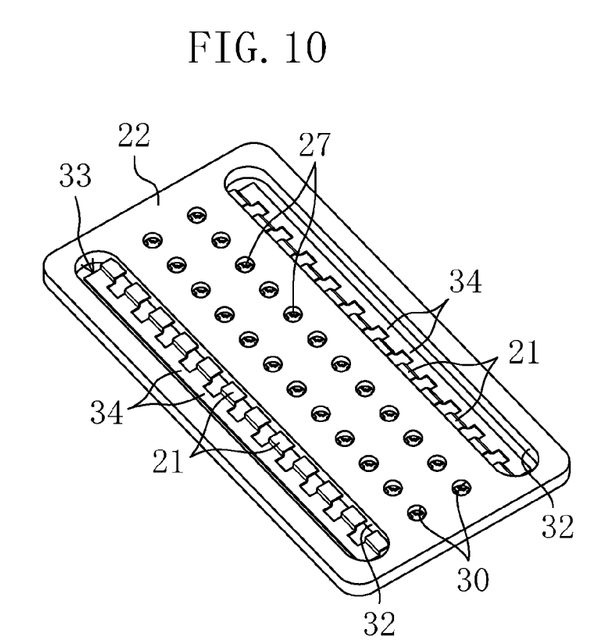
FIG. 10 is an external perspective view of the relay terminals which are processed so as to have steps before cutting.
Figure 11:
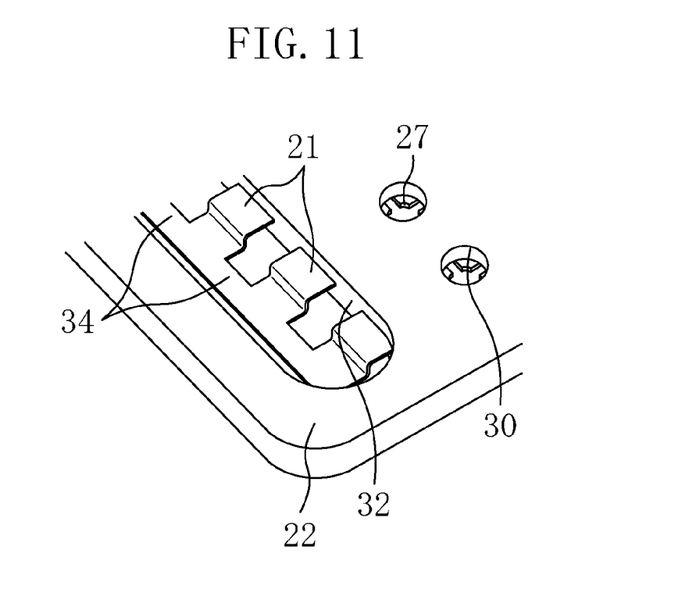
FIG. 11 is an enlarged perspective view of a part of FIG. 10.

FIG. 9 is an external perspective view of relay terminals 21 of the first embodiment before cutting. FIG. 10 is an external perspective view of the relay terminals 21 which are processed so as to have steps before cutting. FIG. 11 is an enlarged perspective view of a part of FIG. 10.

First, a multi-terminal body 33 having relay terminals 21 which are metal thin plates made of, e.g., copper is formed by pressing. In the multi-terminal body 33, terminal sections 25 are connected together through connecting sections 34. At the same time, openings 27 are also formed in the multi-terminal body 33.

Subsequently, the multi-terminal body 33 is placed inside a mold which is not shown in the figure, and then melted PPS resin is injected into the mold so as to cover the multi-terminal body 33. As illustrated in FIG. 9, a covering section 22 is formed by injection molding. At this point, opening grooves 32 and holes 30 are formed in the covering section 22.

Next, as illustrated in FIGS. 10 and 11, both side sections of the multi-terminal body 33 covered by the covering section 22 are pressed to form steps in the opening grooves 32. Subsequently, as illustrated in FIGS. 3 and 4, the connecting sections 34 of the multi-terminal body 33 formed with the steps are cut and removed, thereby forming a plurality of relay terminals 21. The relay terminal member 20 is manufactured by the foregoing process.

Next, a manufacturing method of the circuit structure 10 will be described with reference to FIGS. 1 and 12.

Figure 12:
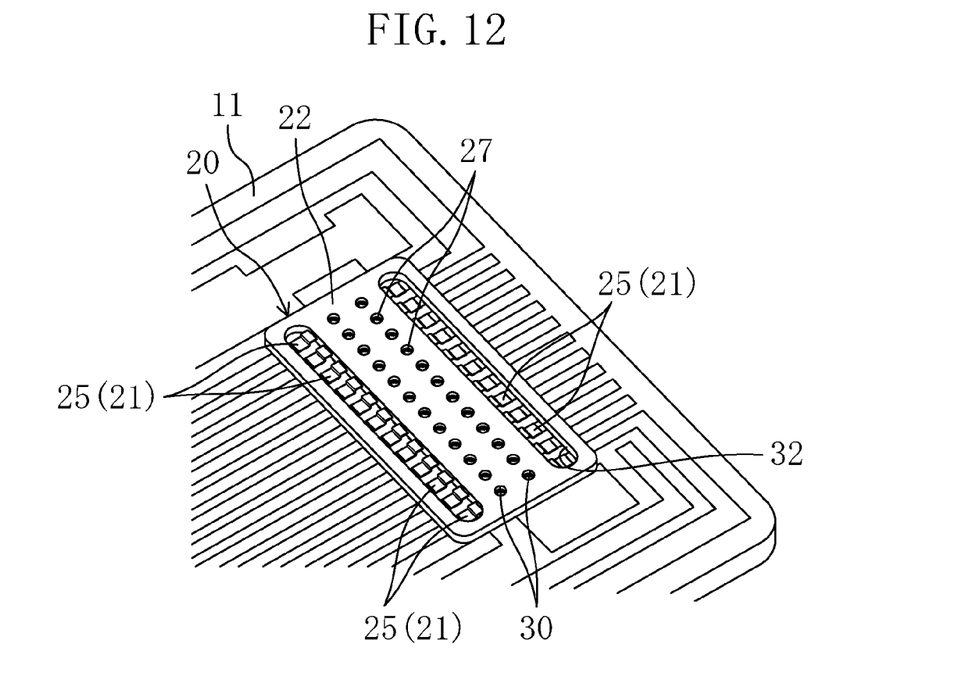
FIG. 12 is a perspective view of the relay terminal member connected to a circuit board in the first embodiment.

FIG. 12 is a perspective view of a relay terminal member 20 connected to a circuit board 11 in the first embodiment.

First, cream solder is applied to a plurality of terminals of the circuit board 11. As illustrated in FIG. 12, terminal sections 25 of the relay terminal member 20 are mounted on the cream solder. Subsequently, the relay terminal member 20 and the circuit board 11 are placed inside a high-temperature furnace, and the cream solder is melted and cured for a short period of time. Then, the plurality of terminal sections 25 of the relay terminal member 20 are bonded to the plurality of terminals of the circuit board 11 by soldering. In such a state, a covering section 22 of the relay terminal member 20 is made of PPS resin resistant to high temperature, thereby not deforming the covering section 22 due to heating.

Subsequently, as illustrated in FIG. 1, a connector 12 is connected to the relay terminal member 20. At this point, a plurality of terminal pins 14 of the connector 12 are inserted to openings 27 inside holes 30 of the relay terminal member 20, and an insulating housing 13 of the connector 12 is engaged and fixed to the circuit board 11.

As illustrated in FIGS. 5 and 6, when inserting the terminal pins 14 to the plurality of holes 30 and the openings 27 of the relay terminals 21, a tip end section of the terminal pin 14 contacts tip end sections of raised sections 29 of the relay terminal 21, which inwardly protrude in the holes 30. Subsequently, when further downwardly inserting the terminal pin 14, the terminal pin 14 deforms the tip end sections of the raised sections 29 of the relay terminal 21 toward a inner wall side of the hole 30.

The "deform" includes elastic deformation and plastic deformation. For example, the tip end section of the raised section 29 is deformed and bent toward the inner wall side of the hole 30. Such bending may be by the elastic deformation or plastic deformation.

As illustrated in FIGS. 7 and 8, when further inserting the terminal pin 14, the bent tip end sections of the raised sections 29 are fitted between an inner wall of the hole 30 and the terminal pin 14 so as to fill a clearance between the inner wall of the hole 30 and the terminal pin 14 inserted to the hole 30.

As a result, the terminal pins 14 of the connector 12 are placed in conduction with the relay terminals 21 through the raised sections 29 of the body sections 24 of the relay terminals 21 of the relay terminal member 20, and the relay terminals 21 are placed in conduction with the terminals of the circuit board 11 through the terminal sections 25. Thus, the connector 12 is placed in conduction with the circuit board 11 through the relay terminal member 20. Note that the tip ends of the terminal pins 14 protrude from a rear surface side of the circuit board 11 through through-holes (not shown in the figure) formed in the circuit board 11. The circuit structure 10 is manufactured by the foregoing process.

Advantages of First Embodiment

According to the first embodiment, the relay terminal member 20 includes the relay terminals 21, each of which has the terminal section 25 to be connected to the circuit board 11, and the body section 24 in which the opening 27 to which the terminal pin 14 of the connector 12 is inserted and connected is formed. Thus, the terminal sections 25 of the relay terminal member 20 are connected to the circuit board 11 by soldering in the furnace, the inside of which is in a high-temperature environment, and then the terminal pins 14 of the connector 12 can be connected to the openings 27 of the relay terminal member 20 under a room-temperature environment. Consequently, the general-purpose connector 12 can be used, which is less resistant to high temperature. That is, even if the low-cost general-purpose connector is used as the connector 12 to be surface-mounted on the circuit board 11, deformation of the connector 12 due to high temperature can be reduced or prevented, thereby enhancing reliability.

The opening 27 includes the notches 28 which are the outwardly-extending cuts. Thus, when inserting the terminal pin 14 to the opening 27, the tip end sections of the raised sections 29 which are a part of the body section 24 around the opening 27 can be easily bent and deformed.

A conduction structure is formed by inserting the terminal pins 14 to the openings 27, and therefore reception terminals are not necessarily provided, which interfere with high integration of electronic components mounted on the circuit board 11, and with reduction in pitch between the holes 30. Thus, a connector which includes terminals arranged in multiple rows at narrower pitch can be employed for the circuit structure 10. In addition, it is not necessary to separately perform a process for forming the reception terminals.

The terminal pin 14 is inserted to the opening 27 of the relay terminal 21, thereby bending and deforming the tip end sections of the raised sections 29 of the relay terminal 21. Thus, even if there is a slight difference in, e.g., the size and the position of the opening 27, conduction is ensured by inserting the terminal pins 14 to the openings 27 without any disadvantages. This allows improvement of manufacturing efficiency of the circuit structure 10, and reduction in manufacturing cost.

Second Embodiment of the Invention

FIGS. 13-18 illustrate a second embodiment of the invention.

Figure 13:
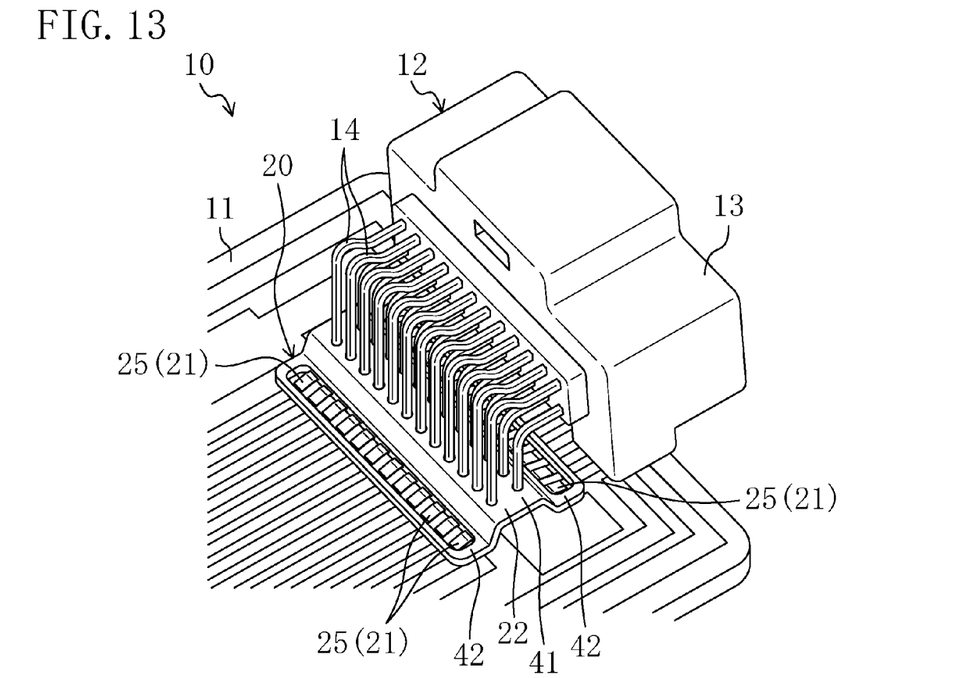
FIG. 13 is an external perspective view of a circuit structure of a second embodiment.
Figure 14:
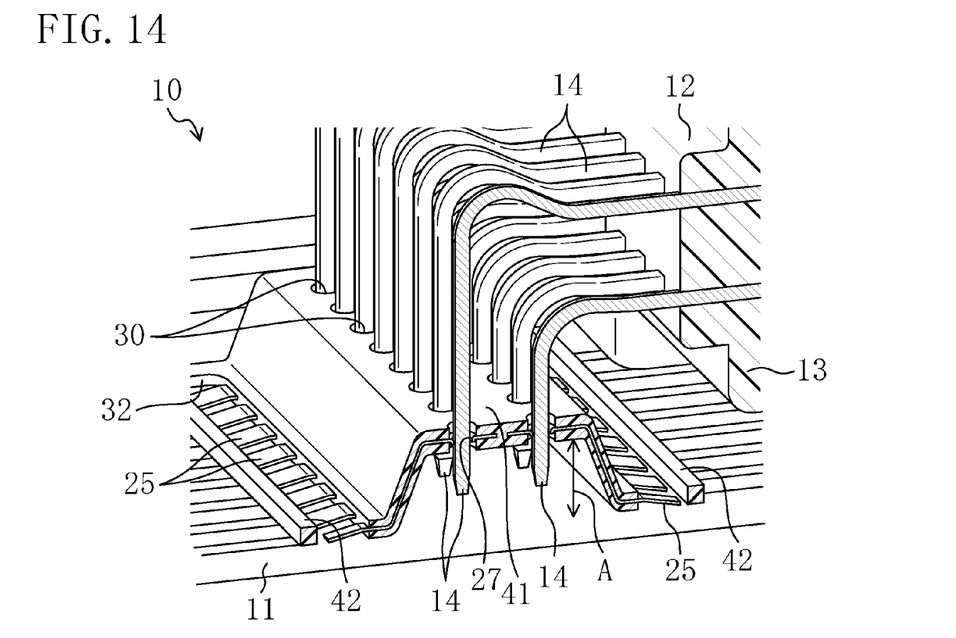
FIG. 14 is a perspective view of openings of a relay terminal member, to which terminal pins are inserted and connected.
Figure 15:
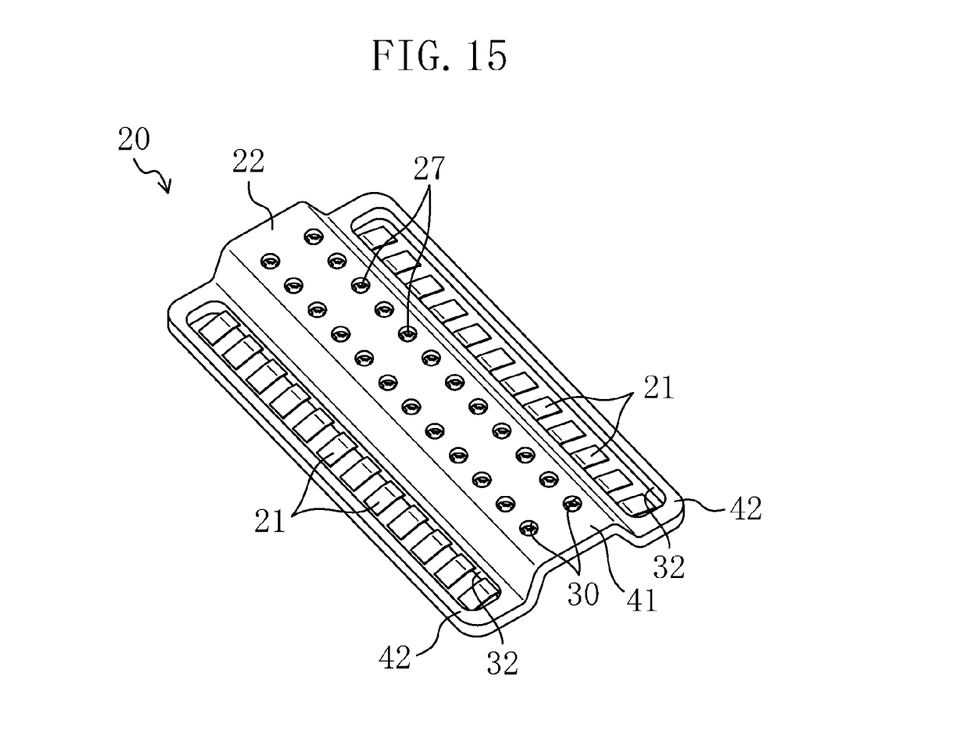
FIG. 15 is an external perspective view of the relay terminal member of the second embodiment.
Figure 16:
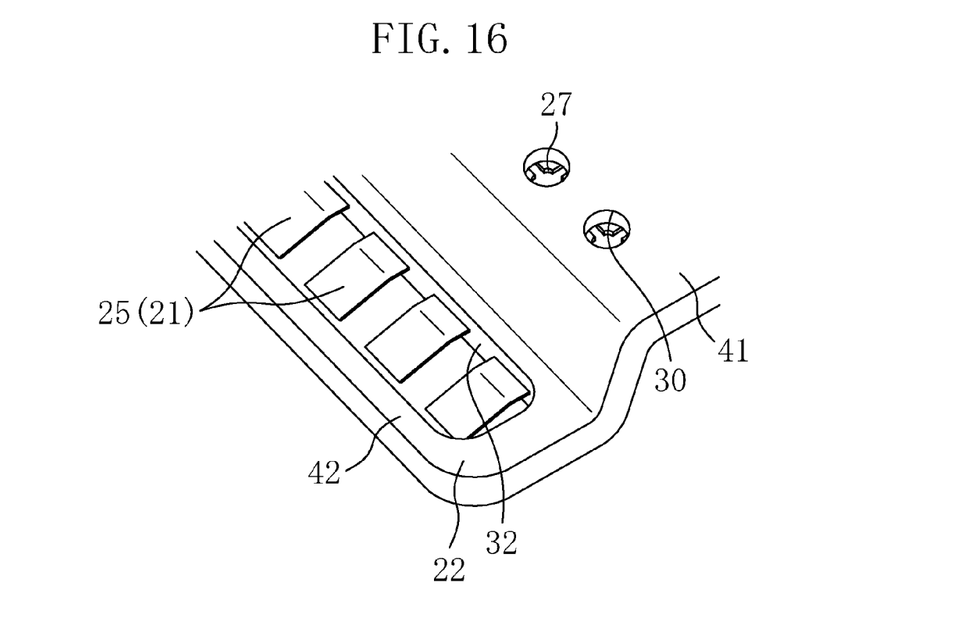
FIG. 16 is an enlarged perspective view of a part of FIG. 15.

FIG. 13 is an external perspective view of a circuit structure of the second embodiment. FIG. 14 is a perspective view of openings of a relay terminal member, to which terminal pins are inserted and connected. FIG. 15 is an enlarged perspective view of the relay terminal member of the second embodiment. FIG. 16 is an enlarged perspective view of a part of FIG. 15.

In the following embodiments, the same reference numerals as those shown in FIGS. 1-12 are used to represent equivalent elements, and the description thereof will not be repeated.

In the first embodiment, the relay terminal member 20 is formed in flat plate-like shape. On the other hand, in the second embodiment, a relay terminal member 20 is formed in plate-like shape with a step so that a middle section 41 of the relay terminal member 20, where holes 30 and openings 27 are formed is provided higher than both side sections 42 adjoining to the middle section 41, where opening grooves 32 and terminal sections 25 are formed, as illustrated in FIGS. 13-15.

Thus, in a state in which the terminal sections 25 of the relay terminals 21 are connected to a circuit board 11, a clearance A is formed between a surface of the circuit board 11 and a surface of a covering section 22 around the holes 30, which faces the surface of the circuit board 11.

Tip ends of terminal pins 14 of a connector 12 are apart from the surface of the circuit board 11 with the terminal pins 14 being inserted and connected to the openings 27 of the relay terminals 21.

A body section 24 of the relay terminal 21 has a cross section formed in crank shape. On the other hand, the terminal section 25 of the relay terminal 21 is formed in flat plate-like shape which is slightly downwardly inclined, and is bonded to a terminal of the circuit board 11 by soldering.

Manufacturing Method

Next, a manufacturing method of a circuit structure 10 and the relay terminal member 20 will be described with reference to FIGS. 13, 17, and 18.

Figure 17:
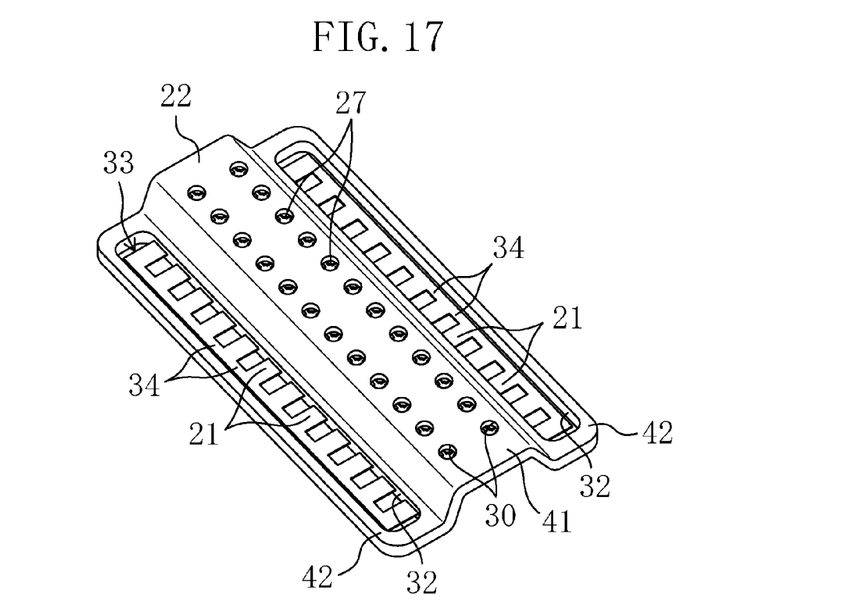
FIG. 17 is an external perspective view of relay terminals of the second embodiment before cutting.
Figure 18:
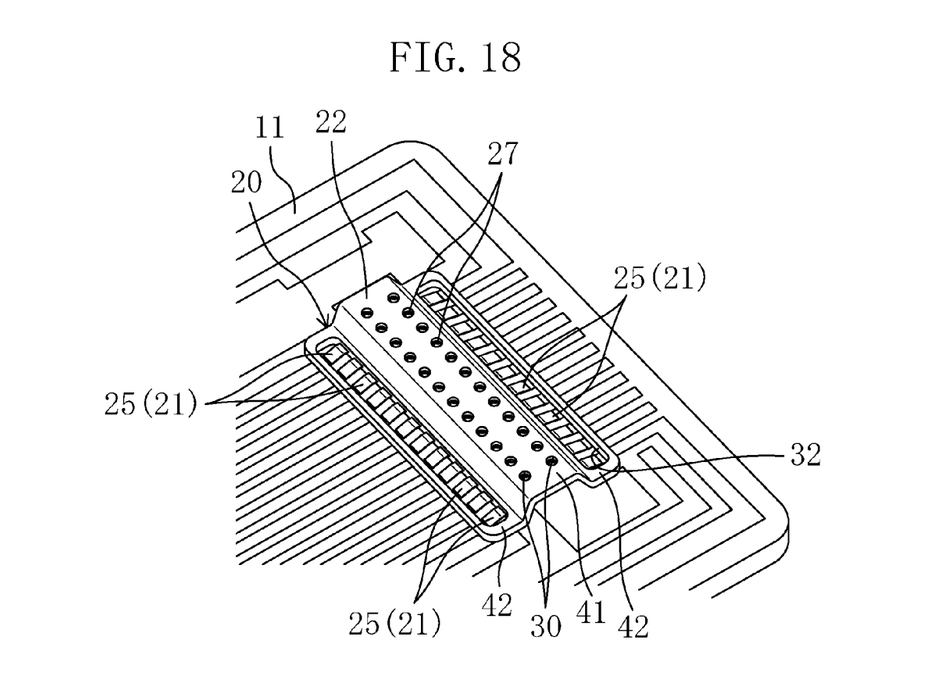
FIG. 18 is a perspective view of the relay terminal member connected to a circuit board in the second embodiment.

FIG. 17 is an external perspective view of relay terminals of the second embodiment before cutting. FIG. 18 is a perspective view of a relay terminal member connected to a circuit board in the second embodiment.

The circuit structure 10 and the relay terminal member 20 of the second embodiment are manufactured in the similar manner to that of the first embodiment. That is, a multi-terminal body 33 having relay terminals 21 is formed so as to have steps by pressing. Openings 27 are formed in the multi-terminal body 33, and terminal sections 25 are connected together through connecting sections 34.

Subsequently, the multi-terminal body 33 is placed inside a mold which is not shown in the figure, and then melted PPS resin is injected into the mold so as to cover the multi-terminal body 33. As illustrated in FIG. 17, a covering section 22 including opening grooves 32 and holes 30 is formed so as to have a step by injection molding.

Then, as illustrated in FIGS. 15 and 16, in both side sections of the multi-terminal body 33 covered by the covering section 22, the connecting sections 34 are cut and removed, and the terminal sections 25 are slightly inclined. The relay terminal member 20 is manufactured by the foregoing process.

Next, cream solder is applied to a plurality of terminals of a circuit board 11. As illustrated in FIG. 18, the terminal sections 25 of the relay terminal member 20 are mounted on the cream solder. Subsequently, the relay terminal member 20 and the circuit board 11 are placed and heated inside a high-temperature furnace, and therefore the plurality of terminal sections 25 of the relay terminal member 20 are bonded to the plurality of terminals of the circuit board 11 by soldering.

Subsequently, as illustrated in FIGS. 13 and 14, a connector 12 is connected to the relay terminal member 20. At this point, a plurality of terminal pins 14 of the connector 12 are inserted to the openings 27 inside the holes 30 of the relay terminal member 20. As in the first embodiment, the terminal pin 14 is placed in conduction with the relay terminal 21 through bent raised sections 29. In a state in which the terminal pin 14 is inserted and connected to the opening 27, the length of a protrusion of the terminal pin 14 on a rear surface side of the relay terminal member 20 is shorter than the clearance A. The circuit structure 10 is manufactured by the foregoing process.

Advantages of Second Embodiment

According to the second embodiment, the relay terminal member 20 also includes the relay terminals 21, each of which has the terminal section 25 to be connected to the circuit board 11, and the body section 24 in which the opening 27 to which the terminal pin 14 is inserted and connected is formed. Thus, advantages similar to those of the first embodiment can be realized.

In addition to the foregoing, the clearance A is formed between the surface of the covering section 22 around the holes 30 and the surface of the circuit board 11, and therefore a tip end section of the terminal pin 14 inserted to the opening 27 can be arranged in the clearance A without penetrating the rear surface side of the circuit board 11. Thus, the rear surface side of the circuit board 11 can be more effectively used.

Other Embodiments

In the first and second embodiments, the opening 27 has the four notches 28, but the shape of the opening 27 is not limited to the foregoing shape. A shape may be employed, which has any number of notches 28 other than the four notches 28; or any other shapes may be employed, which include, e.g., a circular shape having an inner diameter smaller than that of the hole 30 of the covering section 22, an oval shape, a polygonal shape such as a triangular shape and a rectangular shape. Alternatively, the opening 27 may be formed with a plurality of thin slits intersecting with each other.

The foregoing embodiments have been set forth merely for purposes of preferred examples in nature, and are not intended to limit the scope, applications, and use of the invention.

INDUSTRIAL APPLICABILITY

As described above, the present invention is useful for the relay terminal member, the circuit structure including the relay terminal member, and the electronic unit.

DESCRIPTION OF REFERENCE CHARACTERS

A Clearance
10 Circuit Structure
11 Circuit Board
12 Connector
13 Insulating Housing
14 Terminal Pin 20 Relay Terminal Member
21 Relay Terminal
22 Covering Section
24 Body Section
25 Terminal Section
27 Opening
28 Notch
29 Raised Section
30 Hole

The invention claimed is:

1. A relay terminal member configured to relay a circuit board and a connector to each other, and to place the circuit board and the connector in conduction, comprising:
   a plurality of relay terminals, each of which has a body section which is in the form of plate, and in which an opening is formed so as to penetrate the body section; and a terminal section which is integrally formed with the body section, and which is connected to the circuit board; and
   a covering section made of insulating material, including an opening groove through which the terminal sections of the relay terminals are exposed, and covering the body sections of the relay terminals,
   wherein the covering section includes a plurality of holes which are formed so as to penetrate the covering section in positions corresponding to the openings of the relay terminals; and
   the opening of the relay terminal is configured so that, by inserting a terminal pin of the connector to the opening, a part of the body section around the opening is deformed toward an inner wall side of the hole of the covering section, and the deformed part of the body section around the opening contacts the terminal pin of the connector.

2. The relay terminal member of claim 1, wherein the opening of the body section of the relay terminal includes notches which are cuts outwardly extending in a radial direction of the opening.

3. The relay terminal member of claim 1, wherein, in a state in which the terminal sections of the relay terminals are connected to the circuit board, a clearance is formed between a surface of the circuit board and a surface of the covering section around the holes, which faces the surface of the circuit board.

4. A circuit structure, comprising:
   a circuit board;
   a connector; and
   a relay terminal member configured to relay the circuit board and the connector to each other, and to place the circuit board and the connector in conduction,
   wherein the relay terminal member includes a plurality of relay terminals, each of which has a body section which is in the form of plate, and in which an opening is formed so as to penetrate the body section, and a terminal section which is integrally formed with the body section, and which is connected to the circuit board; and a covering section made of insulating material, including an opening groove through which the terminal sections of the relay terminals are exposed, and covering the body sections of the relay terminals;
   the covering section includes a plurality of holes which are formed so as to penetrate the covering section in positions corresponding to the openings of the relay terminals; and
   the opening of the relay terminal is configured so that, by inserting a terminal pin of the connector to the opening, a part of the body section around the opening is deformed toward an inner wall side of the hole of the covering section, and the deformed part of the body section around the opening contacts the terminal pin of the connector.

5. The circuit structure of claim 4, wherein the opening of the body section of the relay terminal includes notches which are cuts outwardly extending in a radial direction of the opening.

6. The circuit structure of claim 4, wherein, in a state in which the terminal sections of the relay terminals are connected to the circuit board, a clearance is formed between a surface of the circuit board and a surface of the covering section around the holes, which faces the surface of the circuit board.

7. An electronic unit, comprising:
   the circuit structure of claim 4.

* * * * *